United States Patent
Anthony et al.

(10) Patent No.: US 6,563,688 B2
(45) Date of Patent: May 13, 2003

(54) ISOLATING ENERGY CONDITIONING SHIELD ASSEMBLY

(75) Inventors: Anthony A. Anthony, Erie, PA (US); William M. Anthony, Erie, PA (US)

(73) Assignee: X2Y Attenuators, LLC, Santa Monica, CA (US)

( * ) Notice: Subject to any disclaimer, the term of this patent is extended or adjusted under 35 U.S.C. 154(b) by 0 days.

(21) Appl. No.: 10/190,889

(22) Filed: Jul. 8, 2002

(65) Prior Publication Data

US 2002/0186100 A1 Dec. 12, 2002

Related U.S. Application Data

(63) Continuation of application No. 09/815,246, filed on Mar. 22, 2001, now Pat. No. 6,469,595.
(60) Provisional application No. 60/191,196, filed on Mar. 22, 2000, provisional application No. 60/200,327, filed on Apr. 28, 2000, provisional application No. 60/215,314, filed on Jun. 30, 2000, and provisional application No. 60/225,497, filed on Aug. 15, 2000.

(51) Int. Cl.[7] .................................................. H01G 4/35
(52) U.S. Cl. ........................ 361/302; 333/184; 333/185
(58) Field of Search .............................. 361/302, 301.2; 333/182, 183, 184; 439/620

(56) References Cited

U.S. PATENT DOCUMENTS

| | | | |
|---|---|---|---|
| 4,814,938 A | | 3/1989 | Arakawa et al. |
| 5,531,003 A | * | 7/1996 | Seifried et al. ............. 29/25.42 |
| 5,544,002 A | * | 8/1996 | Iwaya et al. ................. 361/302 |
| 5,546,058 A | * | 8/1996 | Azuma et al. ............... 333/183 |
| 5,647,766 A | | 7/1997 | Nguyen |
| 5,838,216 A | | 11/1998 | White et al. |
| 5,999,398 A | * | 12/1999 | Makl et al. .................. 361/302 |
| 6,225,876 B1 | | 5/2001 | Akino et al. |

FOREIGN PATENT DOCUMENTS

| | | |
|---|---|---|
| JP | 63-269509 A | 11/1988 |
| JP | 2-267879 A | 11/1990 |

OTHER PUBLICATIONS

PCT International Search Report for International Application No. PCT/US01/09185 Jun. 13, 2002.

* cited by examiner

*Primary Examiner*—Anthony Dinkins
(74) *Attorney, Agent, or Firm*—Robert J. Clark; Hahn Loeser & Parks, LLP

(57) ABSTRACT

A singular or multiple paired, filter capacitor assembly that is comprised of either multilayer or monolithic capacitors and includes selective and arranged attachment to at least a conductive substrate, with operable conductors. This assembly can also include coupled to sets of interleaved-type or monolithic-type ground and active electrodes all arranged in a pre-selected manner for electrical connection into various types of electrical devices.

20 Claims, 2 Drawing Sheets

ISOLATING ENERGY CONDITIONING SHIELD ASSEMBLY

TECHNICAL FIELD

This application is a continuation of application Ser. No. 09/815,246 filed Mar. 22, 2001 now U.S. Pat. No. 6,469,595. Application Ser. No. 09/815,246 is hereby incorporated by reference which claims benefit of provisional application 60/191,196 filed Mar. 22, 2000 which claims benefit of 60/200,327 filed Apr. 28, 2000 which claims benefit of 60/215,314 filed Jun. 30, 2000, which claims benefit of provisional application 60/225,497 filed Aug. 15, 2000.

BACKGROUND OF THE INVENTION

Filters and filter assemblies used with electrical connectors are normally provided for the purpose of protecting sensitive electrical components from transient currents and voltages which develop in a transmission cable due to electromagnetic and radio frequency interference. Such transients are generally high frequency waveforms, and therefore capacitive or tuned pi circuits may be used to shunt the transients to ground without affecting the primary signal carried by the cable.

Prior art, tubular capacitors are normally mounted on the same side of a common ground area within an electrical circuit or electronic device and are primarily effective against common mode noise. Combining these components on the same side of a common ground plane or external conductive area yields a circuit that is susceptible to EMI problems such as ground bounce and cross talk.

Therefore, a need exists for a filter assembly that can provide a range of capacitances, yet utilizes existing technology to yield a multi-feature energy conditioning filter assembly comprised of conventional energy conditioners and a conductive substrate.

These commonly found conventional energy conditioners and conductive substrates are able to form a new energy conditioning filter assembly that is practicable and operable to provide three distinct, isolated energy pathways by physically and electrically positioning each member of at least one pair of energy conditioners on opposite sides of a common conductive energy pathway with respect to each other that will serve as a central isolating barrier, interposed physically and electrically at energization between each energy conditioner of the paired conventional energy conditioners, while still maintaining the versatility of discrete energy conditioners. The added advantage of providing discrete energy conditioners or filters for only those of the contacts requiring filtering and of enabling the conventional materials of the support structure to be more electrically integrated with those of the discrete filter elements.

The claimed invention provides such a filter assembly by arranging the conventional materials and energy conditioners into a two or three energy pathway system and filter structure to accommodate today's EMI/EMC requirements as well as industry economics.

SUMMARY OF THE INVENTION

Accordingly, it is an objective of the invention to overcome the disadvantages of conventional filter assembly and filter connector designs by providing an electrical filter assembly that can provide a range of capacitances with either the conventional monolithic and or discrete energy conditioners filter designs, that combines the ease-of-assembly of a conventional monolithic filter with the versatility of a discrete energy conditioner or capacitor, and that has the added advantage of providing discrete energy conditioners or filters for only those contacts requiring filtering.

It is an objective of the invention to provide filtering of common mode and differential mode noise simultaneously, when combined with an external conductive area.

It is an objective of the invention to provide a filter array for a multiple contact electrical connector, in which the capacitances associated with individual contacts may be varied.

It is an objective of the invention to provide a filter array for a multiple contact electrical connector in which, as with a conventional tubular energy conditioner or tubular energy conditioner/ferrite arrangement, can be utilized with any desired combinations of capacitances that can be provided for energy conductors or the contacts without the need for a separate common capacitance.

It is an objective of the invention to provide a simple low cost filter to assemble.

Finally, it will be appreciated by those skilled in the art that the energy conditioner arrays of the preferred embodiments of the invention may be used in any electrical connector that conventionally uses energy conditioning filters, including D-sub and ARINC type connectors and the like such that the invention is not to be limited to any particular connector con figuration.

DETAILED DESCRIPTION OF THE PREFERRED EMBODIMENTS

Figure 1:
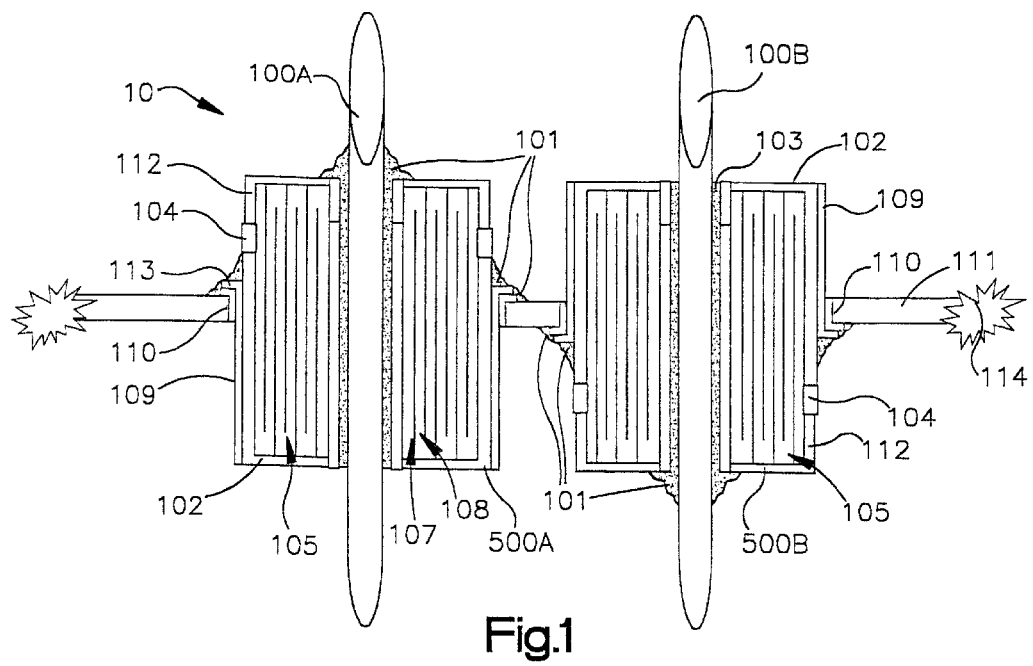
FIG. 1 is a cross-sectional side view of common conductive substrate assembly 10 comprising paired multilayer energy conditioners arranged in a conductive substrate assembly and located on opposite sides of a grounding configuration in accordance with the present invention.

In electricity it is common for various interactions and interrelationships between energy propagations to be described in terms of their complementary dynamics brought about by pairs or pairings of energy portion elements with opposing energies and forces that are interacting from a charged-polarized opposition or electrically opposite, but electrically complementary state to each other.

The interactions that are described herein as dynamic events, in complementary balance, occur by symmetry of pairings and are happening simultaneously, with the same or complementary, mirror-like, reverse positioning of elements such that certain timings of events occur, or are made with the understanding that the one skilled in the art is aware that man-made tolerances and/or limitations used to described or record certain dynamics, while usually done in terms of exacting words or wording meanings, will not always have full applicability to fully describe the matter at hand within the lexicon in the disclosure.

Use of the such words as same, 'complementary', 'simultaneous', 'same-time, same size, same sized, identical, equal, equal-sized', etc. should be understood with the preciseness of the real world, as to what the words mean or are relied upon to convey for explanation the general understanding to what is considered a norm and/or a standard, especially as well, to what is as practicable for standard manufacturing tolerances as normally practice within the state of the art.

The new invention is created when prior art components are placed and combined together in a new way which yields unique and unexpected results when configured into a paired or multiple-paired filter assembly for paired or multiple-paired differential energy conditioning along circuit lines. These paired or multiple-paired elements of prior art such as conductive pin electrodes which are considered herein as differential energy conductors 100A and 100B are combined and amalgamated either before coupling with sleeve 109 or after within standard tubular shaped or rolled tubular elements. This includes other embodiments as well such as other types of capacitive/inductive elements, namely multi-layered tubular capacitors 500 or monolithic tubular capacitors 600 respectively, to form a single energy conditioner, each, respectively, that are then both placed into paired physically opposing complementary positions in relation to one another up to 180 degrees, but specifically they must be on opposite sides of a conductive substrate 111, plane or area regardless of the angle of attachment location.

When energized these combined or amalgamated elements with a few others, will create with the use of a coupled external conductive area, an image plane or voltage reference node, as well as a low impedance path for portions of propagating energies to move. Thus, the filter assembly is practicable for such functions as physically opposing and electrically complementary energy field portion cancellations and/or suppressions, cancellations of mutually coupled inductance fields as well as substantial elimination and/or prevention of ground bounce and cross talk between the differential lines in terms of cross-talk and the between each differential unit and the low impedance energy pathway in terms of ground bounce blocking and prevention.

Figure 2:
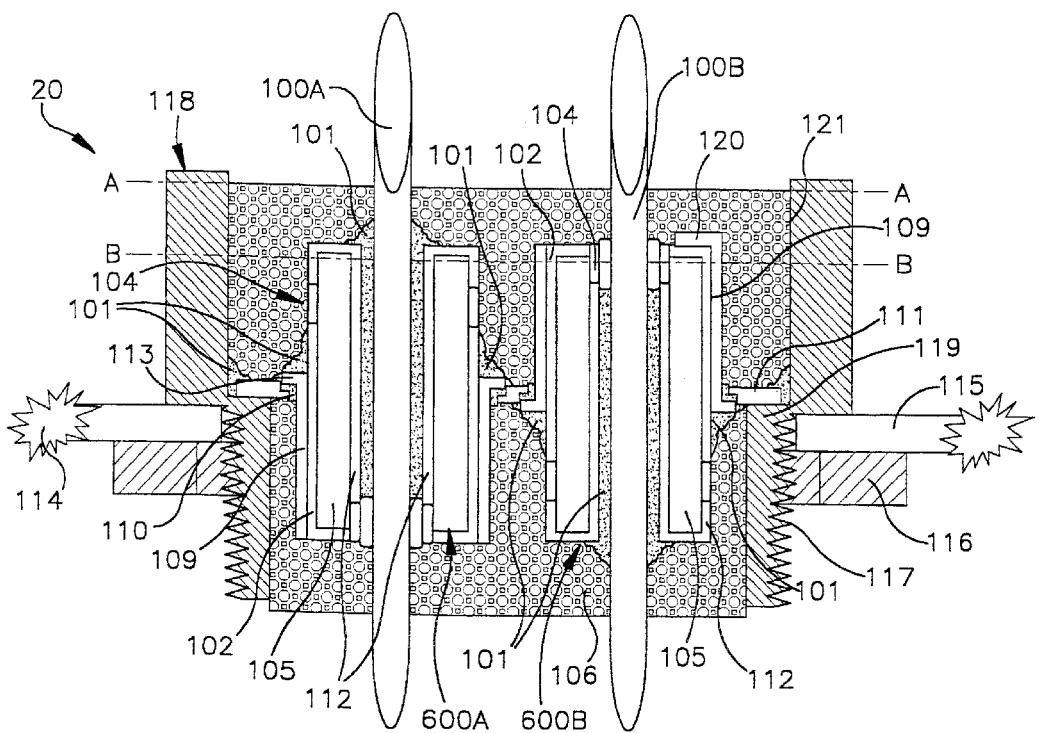
FIG. 2 is a cross-sectional side view of common conductive substrate assembly 20 comprised of paired monolithic energy conditioners arranged in a conductive substrate assembly and located on opposite sides of a grounding configuration now placed in a connector assembly called connector assembly 30 in accordance with the present invention.

When paired energy conditioners such as 500A and 500B and 600A and 600B of FIGS. 1 and 2 are separated physically from one another on either side of an external conductive area, when energized will become isolated from each other electrically, and thus, an image or ground plane is created with the conductive substrate 111 serving as that function. As a result, circuit energy is able to utilize the filters' ability to provide portions of these propagating electrically differential energies the function of conditioning of both differential and common mode noise, simultaneously. Each set of oppositely paired, complementary, energy conditioners such as 500A and 500B and 600A and 600B of FIGS. 1 and 2 and their respective differential electrodes, will operate electrically approximately 180 degrees out of phase to the other during energized operations.

The arrangement of the various energy conditioners that are configured in pairs and located on opposite sides of a conductive substrate such as the version of conductive substrate 111 shown in FIGS. 1 and 2 is unique, in terms of physical arrangement of conventional and prior art elements, as well as their subsequent energization.

The physical element arrangement, as well as the electrical circuit arrangement includes a state or a condition that is called "opposite sides of an image reference or reference ground" Opposite sides of the conductive substrate 111 refers to both physically opposite in a static state, and will be referred to as an electrically opposite positioning in an energized state.

The new energy conditioner filter array or assembly comprises a singular conductive structure 111 that is configured to allow for at least one selective isolation function to be created or operable after this energy conditioning element is mounted with and conductively coupled to the energy conditioners during a non-energized state. The singular conductive structure 111 will also be operable for an additional, selective isolation function during energized operations. Both selective isolation functions will then carry forward simultaneously, in an energized circuit operation. The selective isolation functions will have energy conditioning effects upon propagating energies that are moving along and/or through the various energy conditioners and the differential energy conductors that are amalgamated or combined within portions of the conductive structure 111. This concept is a keystone for providing predetermined electrical and physical isolation of paired energy pathways located both, physically and electrically (when energized) on the opposite side of ground or the conductive substrate.

This conductive substrate 111 also serves as a conductive shielding structure mated with at least the paired energy conditioners to comprise a grouped, electronic circuit conditioning, assembly that is physically or structurally, symmetrical, and balanced in terms of the conductive structural elements. The capacitance values for each tubular energy conditioners 500A and 500B or 600A and 600B when the devices are either multilayer or monolithic capacitors to not necessarily need to be matched. This feature also allows the user the freedom to pick and choose among various capacitance values, for example per contact pin, while maintaining operability of common conductive substrate assembly 10 and common conductive substrate assembly 20, the energy conditioning functions in a complementary, electrically opposing manner.

Thus, it should be noted that it is also not necessarily symmetrical or balanced in terms of the nonconductive elements that when combined with the conductive structural elements to make up a complete isolating energy conditioning shield assembly or energy conditioning shield filter assembly before circuit attachments.

This invention is used to provide a multitude of line conditioning functions such as, but not limited to providing power and signal line filtering, minimizing cross talk, the availability of at least three isolating energy pathways for circuit connection, a portion of energized circuitry that is practicable for performing simultaneous differential and common mode filtering of power and/or signal lines, a wide ranging filtering characteristic for electromagnetic interference (EMI) protection and/or the ability to provide protection from surge events.

More specifically, this invention includes the ability of the user to have a predetermined and pre-positioned selection opportunity for various energy conditioning element configurations that allow for accommodating relatively high pulse currents without degradation or failure in either a by-pass or feed-through configuration by converging the three distinct and electrically isolated energy propagational pathways within a single filter assembly device amalgamation.

The conductive substrate 111 also serves as at least the third energy pathway of the three existing isolating energy pathways to be practicable when the assembly is energized to become the isolated third energy pathway or third conductive energy pathway that will provide portions of propagating energies and energy pathway of least or low impedance, due to the extraordinarily, low inductance created within the filter assembly during energized operations.

This low impedance state, allows portions of energies that are propagating along the remaining two isolated differential energy pathways in most cases, a primary pathway or as an alternative energy pathway, all the while, and at the same time, this third energy pathway will function to block or prevent the similar portions of energies to 'backtrack' back into the energized circuit to cause disruptions. Thus, conductive substrate 111 of the filter assembly like those shown in FIGS. 1 and 2 has the ability to offer a blocking function to portions of energies that have left the assembly's area of convergence (AOC) and is now under the influence of the external common conductive energy pathway from attempting to return.

In other words, the term using the industry called 'ground bounce' is substantially suppressed. Because the conductive substrate 111 is primarily used as a third conductive energy pathway, it will not normally be electrically connected to either a portion of the first conductive energy pathway 112 (not fully shown) or a portion of the second conductive energy pathway 102 (not fully shown), which are serving as the complementary energy pathways during differential energy operations.

To begin with, the tubular energy conditioners or tubular capacitors 500A and 500B and 600A and 600B (as used in this variation) of FIG. 1 and FIG. 2 or the energy conditioners or passive components will now be described. The tubular capacitors are generally known in the art for their use in a wide range of electronic circuit applications. For example, these uses include, use as charge storage device, a circuit coupling or decoupling device, a filtering device, feed thru, etc. For the multilayer version 500A and 500B, this passive component conventionally comprises a plurality of alternating, or interleaved electrode layers 107 and 108 respectively, that are almost totally encased within in material of predetermined electrical properties 105, most notably a dielectric material 105 in a tubular shaped appearance containing alternating layers at a predetermined spacing within a predetermined selected conductive casing material or structures 102 and 112, which are the two conductive electrodes that serve as the boundary or conductive casing of a typical capacitor structure.

A material of predetermined electrical properties 105 can be formulated to have a selected dielectric constant. In the invention, paired, differential electrodes 100A and 100B and common conductive substrate 111 will be connected to appropriate conductive termination points (not shown) or surfaces that include circuit connections (not shown). Conductive terminations are applied to the respective exposed conductive portions or at any appropriate area of the filter energy conditioner elements when placement into circuitry is desired. In addition, in FIG. 1 and FIG. 2 symbol 114 represents continuation of conductive substrate 111. Although not shown, certain conductive terminations or structures may be formed in a host of many known industry possibilities or manners to provide electrical, material coupling or mechanical bonding, conductive coupling, conductive fusing, combined conductive amalgamation of predetermined and selected conductive portions or areas on or within the surface of the invention elements to enable attachment or integration into a circuit for energization. These conductive terminations (not shown) may extend beyond the end margins of a device when surface mounting is desired. Alternative conductive termination methods, including applications of layers of conductive material elements that are compatible with available and future processing technology, can be used.

The present invention overcomes the problems and disadvantages encountered in the prior art by providing an improved circuit conditioning function with a tubular component containing an embedded electrode layer/plate pattern that is capable of handling significantly higher current loads in certain applications.

All this is accomplished not by requiring a significant increase in the volumetric size, but by modifying attachment to a conductive ground area which becomes a "0" reference ground and low impedance path for cancellation of inductance and noise.

Each energy-conditioning element 500A and 500B and 600A and 600B comprises second conductive portions and first conductive portions or electrode portions 102 and 112, which second conductive portions 102 are available for coupling or contacting to the conductive sleeve 109 of conductive substrate 111 or the differential energy conductor's 100A and 100B, respectively.

Specifically, this is a configuration that will be the converse or opposite or even considered, complementary for elements like the second conductive portions and first conductive portions 102 and 112, with respect to how these isolated conductive portions are related to each other. Isolated second conductive portions 102 serve as the primary conductive contact-coupling element with respective to the solder material 101 to coupling the various differential energy conductor pins 100"A" and 100"B", respectively, which are located primarily internal within the aperture or cavity (not shown) created in tubes 500A and 500B and 600A and 600B during their particular manufacturing process. It should be noted that the inserting or hole-making manufacturing processes is not considered part of the invention.

With the addition of conductive solder material 101 or solder reflow material 101, conductive epoxy 101, or any other conductive securing medium commonly known and used in the art of assembling of the tubular devices 500A and 500B and 600A and 600B with differential conductive pins 100A and 100B for further processing is substantially complete.

Energy conditioners 500A and 500B, can be identical in conductive material composition. This potential limitation is different upon the non-conductive passive or inductive materials energy conditioning values that are used to rate or give value to each pin 100's energy conditioning contribution to a specific and circuit portion.

However, regardless of the specific energy conditioning values attributed to tubular units, it is the conductive elements or metallized conductive structures themselves that are needed to provide the initial and necessary symmetrical balance and complementary physical properties for balanced circuit dynamics.

These balanced conductive elements include the alternating multi-layered electrode plates or layers 107,108, which are comprised of noble metal materials or deposits that are separated by a material 105 with predetermined electrode properties such as a dielectric. Each electrode 107 and 108, undergo application, amalgamation, deposit, fusing or attachment to external conductive portions, which are the second conductive portions and first conductive portions or electrode portions 102 and 112 of each respective energy-conditioning unit. Each energy-conditioning unit 500 comprises at least one hole or aperture practicable for receiving the energy conductor or contact pins 100A and 100B (which are identical), there through. Energy conductor or connector pin 100A and 100B are energy conductors that allow transfer or propagations of energies from an energy source to an energy utilizing load and often require the aid of multiple energy conditioning devices to make the transfer or propagation of these energies more efficient, less noisy, or debilitating. Conductive solder, solder reflow material 101, conductive epoxy, or any other known conductive securing medium 101 is deposited or applied to securely connected as well as fight structural support for contact pins 100A and 100B that are positioned therethrough. Various insulating structures such as band 104 are predetermined and selectively applied or positioned at locations found external to each external electrode 102 and 112 of each energy conditioners 500A and 500B. These insulated bands or applications provide separations between second conductive portions and first conductive portions or electrode portions 102 and 112 so that a capacitance can be developed between all the electrodes connected, respectively to each second conductive portions and first conductive portions or electrode portions 102 and 112. Non-conductive void or band 104 located between outer conductive portions of multi-layer tubular energy conditioners 500A and 500B or monolithic tubular energy conditioners 600A and 600B comprises a void or insulation material that provides separation of the electrically conductive second conductive portions and first conductive portions or electrode portions 102 and 112 from each other of multi-layer tubular energy conditioners 500A and 500B or monolithic tubular energy conditioners 600A and 600B.

Solder material 101 servers to physically couple isolated first conductive portions 112 to the various differential energy conductor pins 100"A" and 100"B" in a manner that allows electrical energy to propagate within a circuit.

Isolated second conductive portions 102 serve as the primary conductive contact-coupling element with respective to the physical and conductive coupling to sleeve 109, respectively. Conductive sleeves 109 are normally found as paired elements, that are primarily located either contiguously coupled as a result of the machine operation upon the conductive substrate, thus forming a monolithic substrate that includes the conductive sleeves 109.

Conductive sleeves 109, as illustrated in FIGS. 1 and 2 of the disclosure, are in other cases, separate, discrete elements that are selectively in a predetermined manner coupled to the conductive substrate 111. Conductive substrate 111, is initially manufactured with holes or apertures that are either processed, stamped, or machined, to receive conductive sleeves that are to be conductively coupled to form a singular integral amalgamation of conductive materials or one, unified conductive structure. It should be noted that discrete or separately applied or coupled sleeves 109 are not necessary, and that certain manufacturing techniques not part of the invention, can allow conductive substrate 111 to be stamped or punched with holes (not shown) created in the form of sleeves 109 and formed continuously or contiguously from the one original stamped metal portion 111. Thus, integral to the substrate are the apertures to be the conductive sleeve or at least to be able to accept the conductive sleeve, conductive energy conditioning holder, conductive eyelet for holding either of multi-layer tubular energy conditioners 500A and 500B or monolithic tubular energy conditioners 600A and 600B.

Discrete conductive sleeves or holders 109 are first respectively seated, positioned or located primarily within a pre-positioned hole, aperture or cavity (not fully shown) that was created before mounting of holders 109. With the aid of conductive sleeve lip 113 of holders 109, (which serves in this purpose, as a temporary alignment guide), the primary bonding mechanism, solder material 101 can easily be applied.

Solder material 101 also server, in this case, as the primary electrical coupling mechanism that bridges conductive sleeve 109 to conductive substrate 111 for eventual electrical operations.

Various strategically located insulating portions 110 are selectively placed upon or around predetermined portions of conductive substrate 111 to facilitate the conductive amalgamation of conductive sleeve 109 with conductive substrate 111 for the purposes of forming a monolithic conductive substrate structure and to facilitate the concept that each paired energy conditioning tubular pair is to be separated between conductive substrate 111 from each other. It should be noted that insulating portions 110 are not always needed as long as the attaching soldering material provides an acceptable amalgamation between the substrate 111 and the conductive sleeves 109.

The physical coupling of isolated conductive portions 102 with conductive sleeve 109 can be accomplished through an interference fit in some cases, and can be also done with conductive epoxy in others, but regardless of the coupling technique used to create physical bonding, the result should allow isolated second conductive portion 102 and conductive sleeve 109, to freely exchange electrical energy as part of a circuit.

Other isolation structures or insulated materials portions shown as 103 and the 104 materials which are located on conditioners 500A and 500B and 600A and 600B are simply nonconductive voids or insulating material banding of insulating material deposits selectively positioned to separate outer isolated second conductive portion 102 of multi-layer tubular energy conditioner 500A and 500B or monolithic tubular energy conditioners 600A and 600B from internally located isolated conductive portions 112 of multi-layer tubular energy conditioners 500A and 500B or monolithic tubular energy conditioners 600A and 600B.

Thus, with respect to the solder material 101 coupling of the various differential energy conductor pins 100"A" and 100"B" to either conditioners 500A and 500B and/or conditioners 600A and 600B conditioners, the insulative material 103 deposited or used as insulating filler 103 or "globing" or "goo" can be is applied for the purposes of preventing direct electrical contact between either first conductive portion 112 and second conductive portion 102 as well the purposes of preventing direct electrical contact between second conductive portion 102 and third conductive portions or various differential energy conductor pins 100"A" and 100"B" which will serve to isolate all of the second conductive portions found on either conditioners 500A and 500B and/or conditioners 600A and 600B from any of the additional conductive portions shown or not shown of any other energy conditioners.

To go further, either differential energy conductor 100A or 100B of each multi-layer tubular energy conditioners 500A and 500B or monolithic tubular energy conditioners 600A and 600B is desired to be coupled for electrical dynamics to the first conductive portion 112 or isolated electrode portion 112 that further comprise assembly 10 of FIG. 1 and assembly 20 of FIG. 2, once again solder material 101 can be used.

Once isolation of the second conductive portion 102 and first conductive portion 112 of both of multi-layer tubular energy conditioners 500A and 500B and monolithic tubular energy conditioners 600A and 600B is complete, both portions are now considered to be physically and electrically (when charged) isolated from the other, despite their close proximity.

These paired electrodes of the tubular energy conditioners 500 and 600 are now practicable as isolated energy pathways portions of energy conditioners 500 and 600 and are normally identical in conductive material composition as are the differential energy conductor pin 100"A" and 100"B" that are mated respectively to second conductive portion 102 and first conductive portion 112.

It is noted that identical conductive material composition should not be construed as a limitation with respect to possible heterogeneous mixing of ferro-capacitive energy conditioning structures that could also comprise isolated conductive variant portions of second conductive portion 102 and first conductive portion 112, as this property along with others could be desired and be interchangeable to be operable or practicable filtering solutions depending upon need.

Multi-layer tubular energy 500A is paired with another multi-layer tubular energy 500B. One of the multi-layer tubular energy conditioners 500A and 500B devices is inverted in such a manner as to be turned completely end for end with respect to the other and becomes a opposite mirror of it's counterpart. Multi-layer tubular energy conditioners 500A and 500B comprises material 105 having predetermined electrical properties such as a dielectric material, dielectric material composite, ferro-electrical dielectric material found in both of multi-layer tubular energy conditioners 500A and 500B or monolithic tubular energy conditioners 600A and 600B. (shown in FIG. 2). Energy conditioners 500A and 500B contain a plurality of interleaved electrode layers 107 and 108 which are formed in a conventional manner by printing electrode layers 107 and 108 between layers of an unfired or green ceramic material 105, with openings in the electrodes 107,108 being aligned to form contact openings 104.

Electrode layers 107 form energy return electrodes for the conductive substrate 111 with filter array 10. Each of electrodes 107 and 108 is connected to a metal strip, (or to multiple strips, layers, coatings or the like) 109 on at least one and preferably all sides of the multi-layer tubular energy conditioners 500A and 500B to form terminals which can be electrically connected to energy return by any convenient means such as conductive solder 101. In the illustrated embodiment, electrodes 107 and 108 are connected to energy return through layers 102, conductive sleeve structures 109, conductive solder 101 and conductive substrate 111. Those skilled in the art will appreciate that numerous arrangements for connecting external electrodes 102 of a monolithic conductive substrate 111 with filter array 10 to an energy return are known and that any of them could be substituted for the illustrated energy returning arrangement, which forms no part of the present invention except as noted below.

Unlike the prior multi-layer energy conditioners 500A and 500B, the monolithic tubular capacitors 600A and 600B are arranged to accommodate a dielectric main body 105, a central opening and second conductive portion 102 and first conductive portion 112 within the central opening (not numbered) for receiving differential energy conditioner 100A or 100B.

Moving to FIG. 2, a cross-sectional side view of common conductive substrate assembly 20 comprised of paired monolithic energy conditioners arranged in a conductive substrate assembly 20 and located on opposite sides of a grounding configuration now placed in a connector assembly called connector assembly 30 in accordance with the present invention is shown. Rather than repeat the same structural elements again, only the differences and the setting will be discussed in detail.

FIG. 2 illustrates the universal adaptability of the filter assembly as part of a small, differential 2-Pin assembly 30 situated inside connector assembly 30 almost completely encased in insulative potting material 106 or insulating filler material 106 to complete discrete two piece connector assembly 30.

Figure 3:
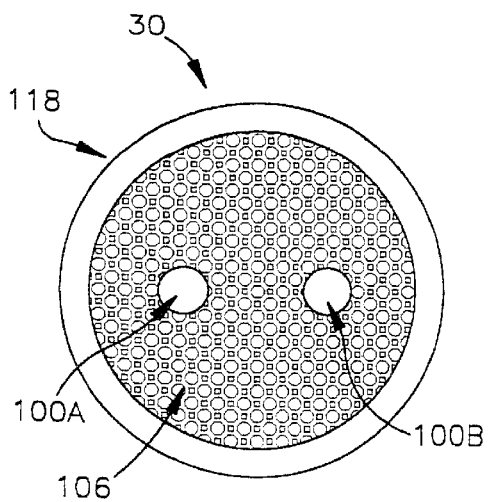
FIG. 3 is a cross-sectional top view of FIG. 2 taken along dotted line "A" showing common conductive substrate assembly 20 comprising tubular energy conditioners arranged in a conductive substrate assembly and located on opposite sides of a grounding configuration now placed in a connector assembly called connector assembly 30 in accordance with the present invention.
Figure 4:
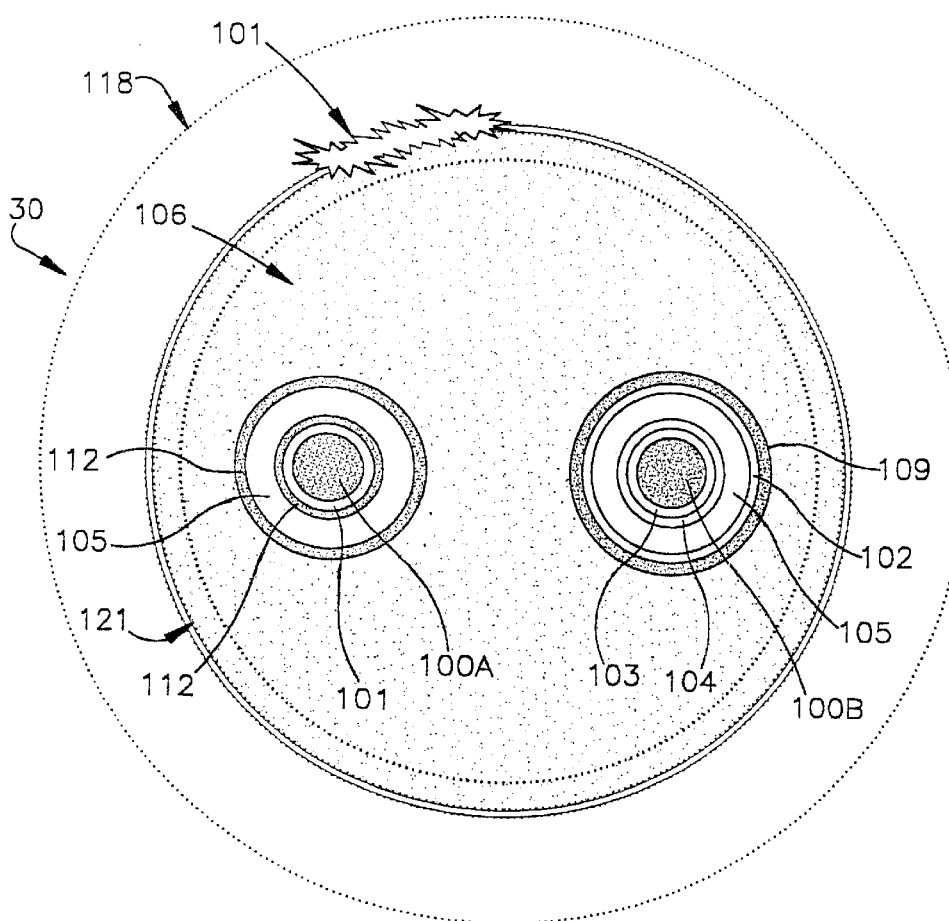
FIG. 4 is a cross-sectional top view of FIG. 2 taken along dotted line "A" showing common conductive substrate assembly 20 comprising tubular energy conditioners arranged in a conductive substrate assembly and located on opposite sides of a grounding configuration now placed in a connector assembly called connector assembly 30 in accordance with the present invention.

Turning to FIG. 3 and FIG. 4, two top perspective views of connector filter assembly 30 are shown. FIG. 3 is showing the top only view of FIG. 2, with no cut away portion, while FIG. 4 is showing a cut away perspective view of FIG. 2 slightly below the top level of connector filter assembly 30 and monolithic tubular energy conditioner 600A and 600B contained within connector filter assembly 30. The outer edge 118 of the connector filter assembly 30 is shown which contains common conductive substrate assembly 20 including monolithic tubular energy conditioner 600A and 600B structures as they are coupled to conductive substrate 111 within filter assembly 30. However, said structures are not shown because 106 insulative potting material or insulating filler material for assembly 30 has filled filter assembly 30 and only energy conductor or contact pins 100A and 100B are shown as they project out of insulative potting material or insulating filler material which is contained in assembly 30.

Specifically in FIG. 3, the outer edge 118 of the connector assembly 30 is shown which contains common conductive substrate assembly 20 within. The entire common conductive substrate assembly 20 is not shown because insulative potting material or insulating filler material 106 for assembly 30 is filled in this diagram. Connector assembly 30 shows only differential energy conductors or contact pins 100A and 100B as they are shown projecting out of insulative potting material 106 (which is removed for explanation purposes in FIG. 4) for further availability for usage in an electrical application.

FIG. 4 is showing an overhead cutaway view of connector filter assembly 30. Shown are differential energy conductor pins 100"A" and 100"B" as they project from the connector assembly 30 for allowing propagation of energies to enter or leave common conductive substrate assembly 20 for eventual conditioning of portions of electrically complementary energies propagating in opposite directions, electrically out of phase with each other in the AOC, simultaneously. Monolithic tubular energy conditioners 600A and 600B are coupled at predetermined portions to sleeves 109 and then to conductive substrate 111 of common conductive substrate assembly 20 by solder means 101.

Moving out and away from the third conductive portion or central positioned differential conductor 100B of 600B is insulating material 103, which acts as a spacer between the third conductive portion, or central positioned differential conductor 100B and first conductive portion or external electrode portion 112 of monolithic tubular energy conditioner 600B.

Non-conductive void or banded insulating material 104 separates physically first conductive portion or external electrode portion 112 from second conductive portion or electrode isolated portion 102 and third conductive portion, or electrode isolated portion, or differential conductors 100B, as does insulating material 103.

Dielectric or supportive material 105 is shown and as stated these 105 materials can be customized to the requirements of the circuit into which the entire assembly is utilized. Second conductive portion or isolated conductive portion or electrode 102 is appears on the outer portion of dielectric or supportive material 105. Second conductive portion or isolated conductive portion or electrode 102 will make conductive coupling contact with conductive sleeve 109, in this case by positioning monolithic tubular energy conditioner 600B within to a predetermined position for optimal electrical contact. The non-conductive material band 110 can be placed between to separate conductive sleeve 109 from conductive substrate 111, if desired.

Insulative potting material 106 almost totally surrounds conductive energy conditioning holder 109 as shown in the cutaway view. Not shown in FIG. 4 is an optional lip portion 120 of sleeve 109 which is either formed, coupled to or simply an elongated portion at the end of sleeve or holder 109 for preventing slippage of the of multi-layer tubular energy conditioners 500A and 500B or monolithic tubular energy conditioner 600A and 600B beyond the pre-selected points of positioning and coupling.

Moving out and away from the central positioned third conductive portion, or central positioned differential conductor 100"A" is conductive solder 101 as it couples third conductive portion, or central positioned differential conductor 100A with the first conductive portion, or external isolated electrode portion 112 of monolithic tubular energy conditioner 600A.

The first conductive portion, or isolated electrode portion 112 is non-conductively coupled to dielectric or supportive material 105. Isolated portion 112 is placed against dielectric or supportive material 105 for support as it eventually will conductive coupling to substrate 111 by resistive fit, mechanical means or soldering as with conductive solder 101.

It should be noted that second isolated conductive portions 102 on all conditioners 500A and 500B and 600A and 600B are isolated from each respective third conductive portion or external isolated electrode portion 111 and each respective third conductive portion or differential conductors 100"A" and 100"B", respectively in a predetermined manner by non-conductive void or band materials 104, insulation material 103, if needed as well as selective positioning or location of 112 and 102 relative to actual positioning on the capacitor tubes as well and as required to make a proper functioning circuit as is proposed by this invention and is illustrated in FIG. 4.

The illustration shown is by no means meant to limit the other possibilities of achieving the same resulting invention circuitry by other employed methodology. The last area to be shown is the conductive solder 101 as it couples second conductive portion or external electrode portion 102 to conductive substrate 111 to further amalgamate the common conductive substrate assembly 20 into a single working unit.

Turning back to FIG. 2, this image illustrates that the combined conductive elements that make up the common conductive substrate assembly 20 and that are further amalgamated by solder 111 to the inside portion of filter connector sleeve 118. Filter connector sleeve 118 is contains and is surrounding the 111-substrate assembly holding the tubular devices 600. The filter connector sleeve 118 is also considered a connector shell or conductive shell, which with bushing 116 and the threaded portion 117 of the 118 shell is operable to be considered sandwiching a larger conductive plane or conductive connector holder 115. With the availability of the top portion 119 of the threaded bushing portion 117, this shelf created by the connector structure is adapted and is conveniently used for resting the conductive substrate 111 or holding the conductive substrate 111 for eventual soldering of the mounting to side wall portion 121 and than the 'gooing' with material 106, as well as for additional overall structural support of substrate 111, in the discrete, 2-piece connector assembly 30 application.

Connector shell 118 in this case is using a threaded bushing 117 that facilitates the sandwiching of conductive plane 115 together with threaded washer or threaded bolt 116 as well, but other forms of connection of the shell can be used and are to numerous to mention.

It is safe to say that connector assembly 30 is interchangeable to as it is related to providing common conductive substrate assembly 10 or common conductive substrate assembly 20 accesses to electrical applications and that regardless of the container means used, it is the unique arraignments of the common conductive substrate assembly 20 with the paired energy conditioners as they are in relative position to each other on opposite sides of conductive substrate 111 that is very important.

Conductive substrate 111 becomes the isolating element for differential conditioning of propagating energies moving along 100A and 100B conductors of either common conductive substrate assembly 10 or common conductive substrate assembly 20.

The common conductive attachment of the 102s' which are the second conductive portion of most energy conditioners is also an isolated conductive portion or electrode coupled to the sleeve 109 and will be allowing the shielding function provided by conductive substrate 111 to be both a physical shield as well as to allow certain propagating portions of propagating energies to be electrically interposed or electrically separated between each side of conductive substrate 111 when located at any given point in time along the third conductive portions of tubes 600 and 500 which are the respective differential conductors, 100A and 100B when coupled to a circuit.

Such three-way energy pathway amalgamation or selective and predetermined circuit coupling as described in this disclosure comprises not only the center common shield structure 111 that will become a "0" reference image plane for the circuit, but other portions of a typical new invention circuit which can comprise the following: an energy source, a first energy pathway connecting from the energy source to third conductive portion or differential energy conductor pin 100A, of 500A for example, the first energy pathway then continuing through tubular element to first conductive portion 112 of energy conditioner 600 and then onward along a first energy pathway for delivering portions of the propagating energies to an energy utilizing-load.

After portions of energies are utilized by the load, a second energy pathway connecting from the load is found to be connecting to differential energy conductor pin 100B or third conductive portion of the other paired energy conditioner 500B which is now electrically on the opposite side of the circuit reference node created by conductive substrate 111's position and attachments and as was done with the complementary tube 500A, portions of propagating energy will pass on along third conductive portion differential energy conductor pin 100B, while other energy portions move to first conductive portion 112 to will receive or undergo conditioning from second conductive portions 102 which are isolated from first conductive portions 112 and the third conductive portions 102's respect to each portions location on all of multi-layer tubular energy conditioners 500A and 500B or monolithic tubular energy conditioner 600A and 600B, as disclosed.

After leaving the AOC or the area of convergence with respect to of multi-layer tubular energy conditioners 500A and 500B or monolithic tubular energy conditioner 600A, 600B, and the various portions of energies continue along differential energy conductor pin 100B's and propagate back to the original energy source.

During this dynamic process of energy propagation along this new invention circuit combination, portions of energies will also propagate to first conductive portion or isolated conductive electrode portion 112 from the various coupled third conductive portions, of course. However, other portions of energies will also propagate or form to the second conductive portions or isolated conductive portions 102 (that are isolated from first and third conductive portions) and of which 102 is conductively connected to sleeve 109, which is in turn connected to conductive substrate 111.

Conductive substrate 111, is conductively coupled by conductive attachment material 101 to the inside of connector assembly 30s' housing 118 which in turn, is securely fastened and sandwiching portions of larger conductive substrate 115. Larger conductive substrate 115 can be a third energy pathway end point in and of itself to serve as a final portion of the third energy pathway on its own. On the other hand, larger conductive substrate 115, in this application for example could further be coupled or conductively connected to a chassis ground or even an earth ground, but does not necessarily need to be operated at all as a pathway the back to the energy source from which portions of energies initiated.

Although the principal embodiments and operations of the present invention have been described in detail herein, this disclosure is not to be construed as being limited to the particular illustrative forms disclosed. It will thus become apparent to those skilled in the art that various modifications of the principal embodiments herein can be made without departing from the spirit or scope of the invention as defined by the appended claims, below.

What is claimed:

1. A conditioning assembly, comprising:
    a first and a second conditioner, each said conditioner having a plurality of portions;
        wherein at least a first portion of said plurality of portions of each said conditioner is electrically isolated from the other;
    a structure, said structure electrically coupled to each said conditioner;
        wherein said structure shields each said conditioner from the other; and
    wherein each said conditioner is positioned complementary to the other.

2. The conditioning assembly of claim 1, wherein at least a second portion of said plurality of portions of each said conditioner is electrically isolated from the structure.

3. The conditioning assembly of claim 1, in which each said conditioner is tubular in shape.

4. The conditioning assembly of claim 1, in which each said conditioner is multilayered.

5. The conditioning assembly of claim 2, in which said conditioning assembly has a line to line capacitor.

6. An energy conditioning network, comprising:
    a conductive means for shielding energy;
    a plurality of conditioners, each conditioner of said plurality having at least a first, a second and a third portion;
    wherein a first and a second conditioner of said plurality are oppositely positioned and oriented from one another;
    wherein said first and said second conditioner are electrically coupled to said conductive means; and
    wherein at least said first portions of said first and said second conditioner are electrically isolated from one another.

7. The energy conditioning network of claim 6, in which each conditioner of said plurality is multi-layered.

8. The energy conditioning network of claim 6, in which each conditioner of said plurality is tubular in shape.

9. The energy conditioning network of claim 7, in which said energy conditioning network is a filter.

10. The energy conditioning network of claim 8, in which said energy conditioning network has a line to line capacitor.

11. The energy conditioning network of claim 6, in which said energy conditioning network has plurality of bypass capacitors.

12. The energy conditioning network of claim 6, in which said energy conditioning network is a connector.

13. A capacitor network, comprising:
    a substrate;
    a plurality of capacitors, each capacitor of said plurality has a plurality of portions;
    wherein at least a first and a second capacitor of said plurality of capacitors are electrically coupled to said substrate;
    wherein at least one portion of said plurality of portions of each of said first and said second capacitor are electrically isolated from one another; and
    wherein said substrate at least shields said at least one portion of said plurality of portions of each of said first and said second capacitor from one another.

14. The capacitor network of claim 13, in which at least one capacitor of said plurality of capacitors is multi-layered.

15. The capacitor network of claim 13, in which at least one capacitor of said plurality of capacitors is tubular in shape.

16. The capacitor network of claim 14, in which said capacitor network is a filter network.

17. The capacitor network of claim 15, in which said capacitor network is a filter connector.

18. An electrical circuit comprising:
    an energy source;
    a load;
    a first, a second and a third pathway, each said pathway electrically isolated from the other;
    a first and a second capacitor, each said capacitor having at least a first, a second and a third portion;
    a structure, said structure electrically coupled to third pathway;
    wherein said first portion of said first capacitor is electrically coupled to a first side of said structure;
    wherein said first portion of said second capacitor is electrically coupled to a second side of said structure;
    wherein said first pathway and said second and said third portion of said first capacitor are electrically coupled to one another;
    wherein said second pathway and said second and said third portion of said second capacitor are electrically coupled to one another; and wherein said first and said second pathway are each electrically coupled to said energy source and said load.

19. The electrical circuit of claim 18, operable as an energized circuit.

20. A filter network, comprising:

at least a plurality of energy conditioners including a first and a second energy conditioner, each said energy conditioner having at least a first, a second and a third portion;

a structure, said structure electrically coupled to said plurality;

wherein said first portion of each said first and said second energy conditioner are in opposite orientation to the other and separated by said structure; and wherein said first portion of each said first and said second energy conditioner are electrically isolated and shielded from the other.

* * * * *